United States Patent
Cu, Jr.

(10) Patent No.: US 6,615,994 B2
(45) Date of Patent: Sep. 9, 2003

(54) WAFER BOAT

(75) Inventor: Ruben S. Cu, Jr., Quezon (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/955,724

(22) Filed: Sep. 18, 2001

(65) Prior Publication Data

US 2003/0052039 A1 Mar. 20, 2003

(51) Int. Cl.$^7$ ................................................ A47G 19/08
(52) U.S. Cl. .................... 211/41.18; 206/454; 118/500
(58) Field of Search ................. 211/40, 41.12, 211/41.18, 41.1, 41.4, 184, 181.1, 50–51, 133.5, 133.2, 90.03, 90.04, 189, 153, 106; 206/454, 832, 710–711, 564, 557; 437/247, 946; 414/935; D13/682; 312/334.1, 132, 265.2, 265.3, 223.3; 118/500; 432/253, 258, 259

(56) References Cited

U.S. PATENT DOCUMENTS

| | | | | | |
|---|---|---|---|---|---|
| 3,889,815 | A | * | 6/1975 | Merle | 206/454 |
| 3,949,891 | A | * | 4/1976 | Butler et al. | 118/500 |
| 4,228,902 | A | * | 10/1980 | Schulte | 118/500 |
| 5,310,339 | A | * | 5/1994 | Ushikawa | 432/258 |
| 5,332,105 | A | * | 7/1994 | Stanfield | 211/4 |
| 5,408,939 | A | * | 4/1995 | Lechman | 108/107 |
| 5,634,563 | A | * | 6/1997 | Peng | 206/308.1 |
| 5,641,076 | A | * | 6/1997 | Englund | 206/454 |
| 6,032,802 | A | * | 3/2000 | Ejima et al. | 206/454 |
| 6,036,031 | A | * | 3/2000 | Ishikawa | 118/500 |
| 6,039,186 | A | * | 3/2000 | Bhatt et al. | 206/454 |
| 6,099,645 | A | * | 8/2000 | Easley et al. | 118/500 |
| 6,133,121 | A | * | 10/2000 | Tsunashima et al. | 118/500 |
| 6,341,935 | B1 | * | 1/2002 | Tseng | 118/500 |
| 6,382,419 | B1 | * | 5/2002 | Fujimori et al. | 206/454 |
| 2003/0010672 | A1 | * | 1/2003 | Simpson et al. | 211/41.18 |

\* cited by examiner

Primary Examiner—Daniel P. Stodola
Assistant Examiner—Jennifer E. Novosad
(74) Attorney, Agent, or Firm—Blakely, Sokoloff, Taylor & Zafman LLP

(57) ABSTRACT

A frame of a wafer boat is retrofitted with brace assemblies. The frame has left and right vertically extending, horizontally spaced supports. Each support has a plurality of slots above one another. A plurality of substantially horizontal wafers are horizontally insertable above one another with respective left edges of the wafers in respective ones of the slots of the left support and respective right edges of the wafers in respective ones of the slots of the right support. Each brace assembly includes a plurality of braces. Each brace has a respective upper surface in a respective position to support a lower surface of a respective wafer between and distant from the slots in which the left and right edges of the wafer are inserted.

15 Claims, 5 Drawing Sheets

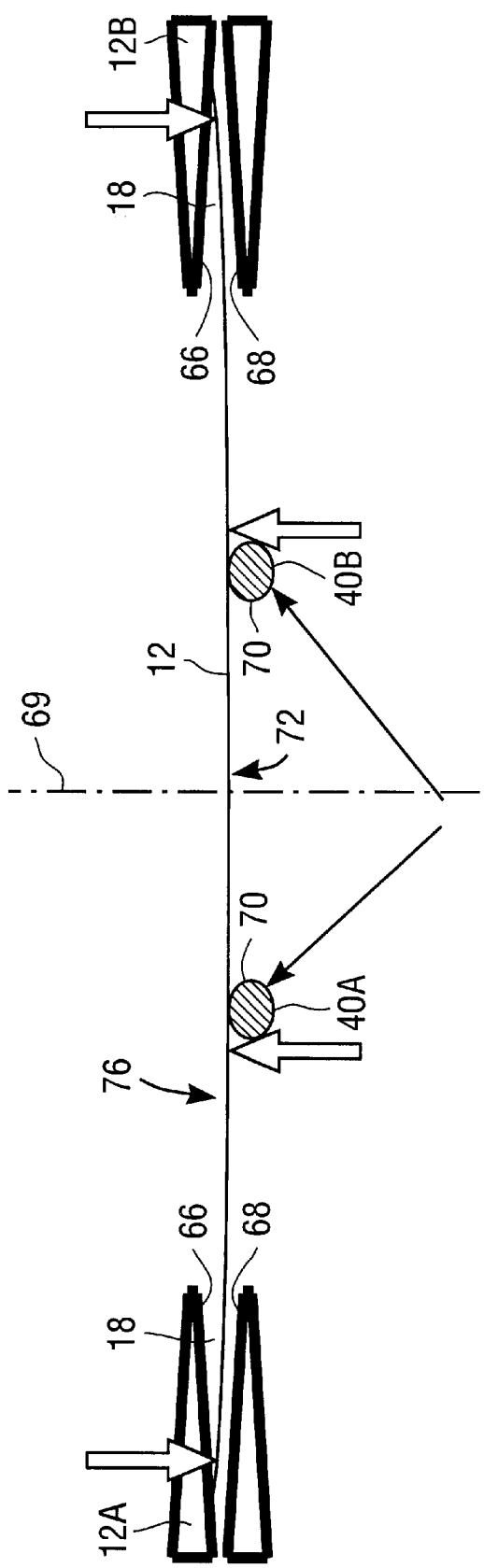

WAFER BOAT

BACKGROUND OF THE INVENTION

1). Field of the Invention

This invention relates to a wafer boat of the kind in which wafers are insertable for purposes of transporting the wafers.

2). Discussion of Related Art

Integrated circuits are often manufactured in and on silicon and other semiconductor wafers. Integrated circuit fabrication calls for transportation of wafers from one location to another. Wafers may be located in a batch in a wafer boat. The wafer boat typically includes a frame having left and right vertically extending, horizontally spaced supports, each having a plurality of slots above one another. The wafers, located in horizontal orientations, are horizontally insertable above one another with respective left edges of the wafers in respective ones of the slots of the left support and respective right edges of the wafers in respective ones of the slots of the right support.

Wafer boats are traditionally used for transporting wafers which are approximately 1 mm thick. Wafer boats are generally unsuitable for transporting thinner wafers, such as wafers resulting from a back-grind operation and having a thickness in the region of 0.12 mm. Such wafers may bend, causing them to become dislodged from the slots, to break, or to contact one another.

BRIEF DESCRIPTION OF THE DRAWINGS

The invention is described by way of example with reference to the accompanying drawings wherein:

FIG. 4 is a cross-sectional end view illustrating how one wafer is supported by slots in the frame and braces of the brace assembly;

DETAILED DESCRIPTION OF THE INVENTION

Figure 1:
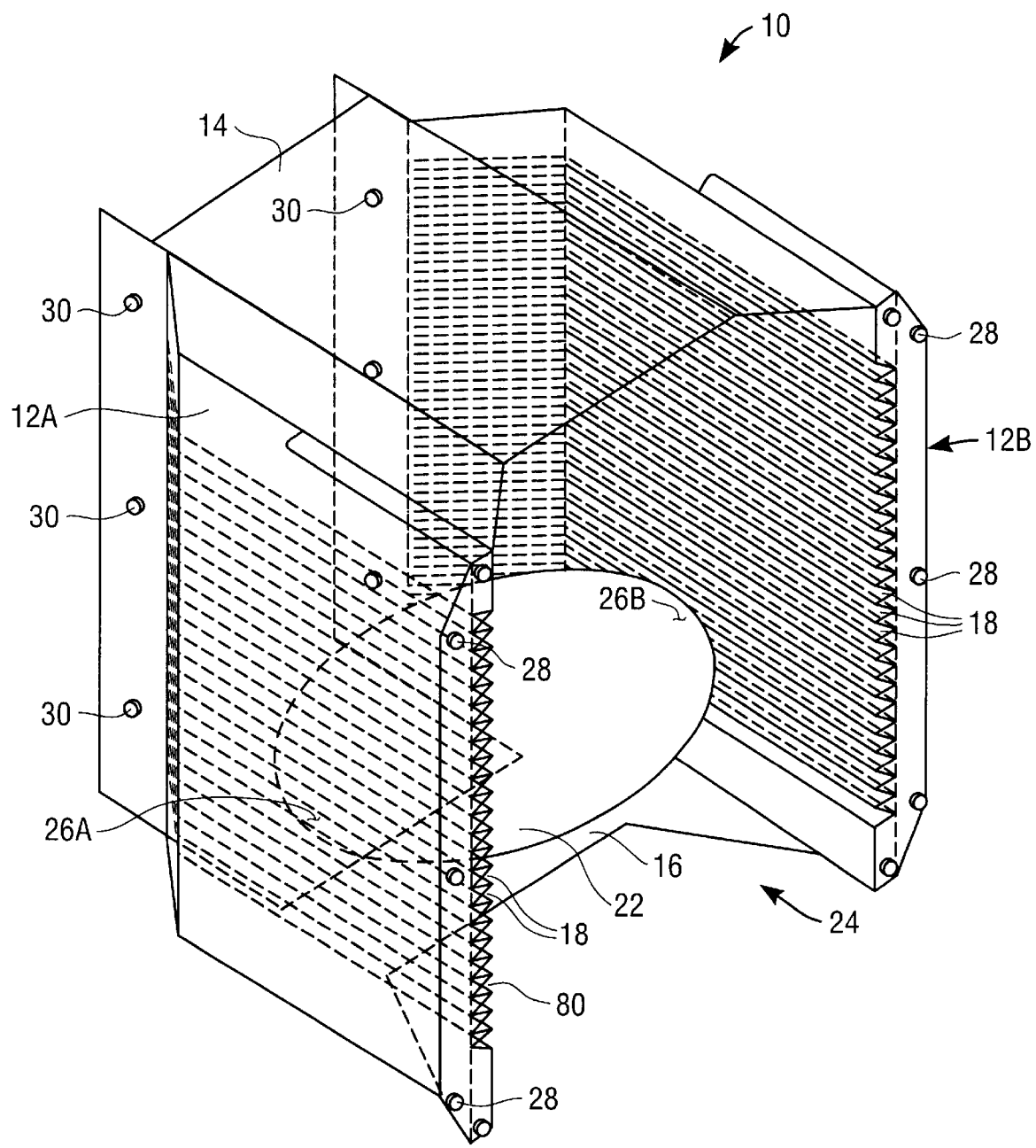
FIG. 1 is a perspective view of a frame of a wafer boat according to an embodiment of the invention.

FIG. 1 of the accompanying drawings illustrates a frame 10 of a wafer boat before brace assemblies are mounted thereto. The frame 10 includes left and right vertically extending supports 12A and 12B, an upper portion 14, and a base portion 16. The supports 12A and 12B are horizontally spaced from one another. Upper ends of the supports 12A and 12B are secured to the upper portion 14 and lower ends of the supports 12A and 12B are secured to the base portion 16 to finalize construction of the frame 10.

Horizontal slots 18 are formed in inner surfaces of the supports 12A and 12B. A wafer 22 located in a horizontal plane is insertable in a horizontal direction 24 between the supports 12A and 12B. A left edge 26A of the wafer is located in one of the slots 18 in the left support 12A and a right edge 26B of the wafer is located in one of the slots 18 in the right support 12B. A plurality of wafers are insertable above one another with each wafer having a left edge in one of the slots 18 in the left support 12A and a right edge in one of the slots 18 in the right support 12B.

Each support 12A and 12B has a respective front face with a plurality of threaded openings 28 formed therein. Each support 12A and 12B also has a respective rear portion with a plurality of threaded openings 30 formed therein.

Figure 2:
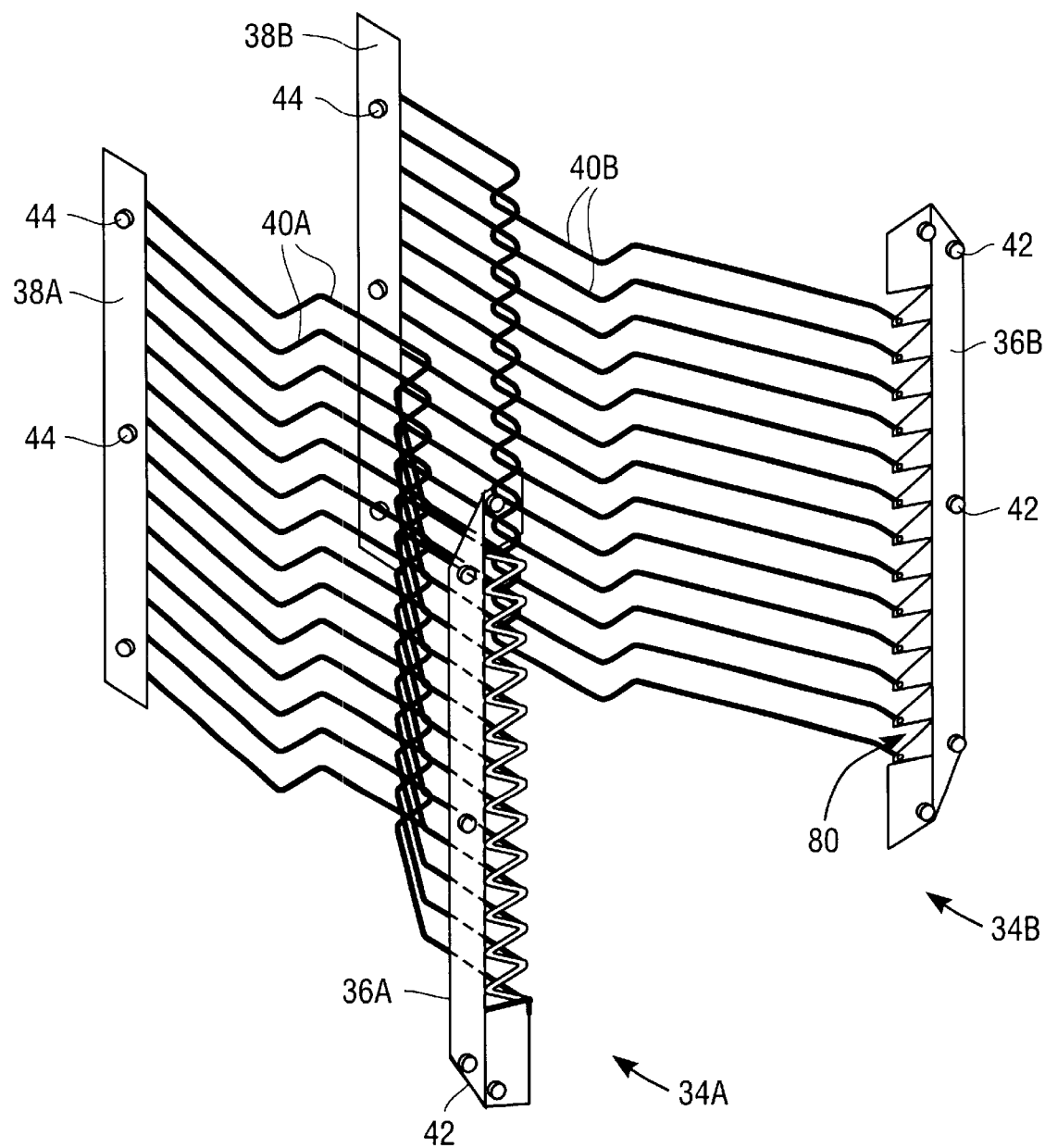
FIG. 2 is a perspective view of left and right brace assemblies of the wafer boat.

FIG. 2 illustrates left and right brace assemblies 34A and 34B of the wafer boat. The left brace assembly 34A includes a left vertically extending front mount bracket 36A, a left vertically extending rear mount bracket 38A, and a plurality of left braces 40A. Each left brace 40A has a respective front end secured to the left vertically extending front mount bracket 36A and a rear end secured to the left vertically extending rear mount bracket 38A. The left braces 40A are located vertically above one another.

The right brace assembly 34B includes a right vertically extending front mount bracket 36B, a right vertically extending rear mount bracket 38B, and a plurality of right braces 40B. Each right brace 40B has a front end secured to the right vertically extending front mount bracket 36B and a rear end secured to the right vertically extending rear mount bracket 38B. The right braces 40B are located vertically above one another.

The front mount brackets 36 have a plurality of fastener openings 42 formed therein. Similarly, the rear mount brackets 38 have a plurality of fastener openings 44 formed therein.

Figure 3:
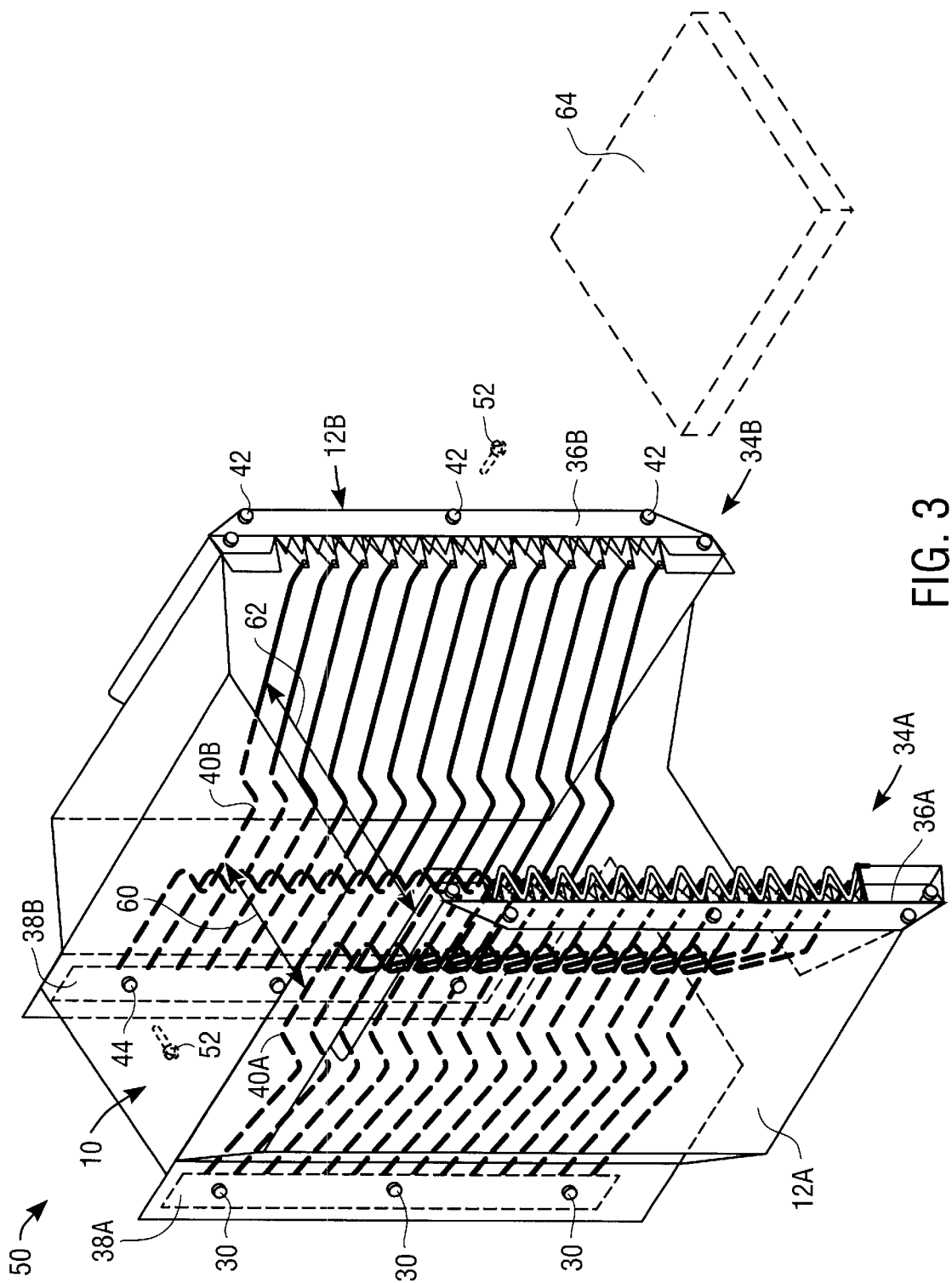
FIG. 3 is a perspective view of a wafer boat according to an embodiment of the invention including the frame and the brace assemblies.

FIG. 3 illustrates a wafer boat 50 which is constructed utilizing the frame 10 and the brace assemblies 34A and 34B. The brace assemblies 34A and 34B are inserted between the left and right supports 12A and 12B. The left and right vertically extending front mount brackets 36A and 36B are located on the front faces of the left and right supports 12A and 12B. The left and right vertically extending rear mount brackets 38A and 38B are located on inner surfaces of the rear portions of the left and right supports 12A and 12B, respectively. The wafer boat 50 also includes fastener screws 52. A respective fastener screw 52 is located through a respective fastener opening 42 or 44 and screwed into a respective threaded opening 28 or 30 in the supports 12A or 12B. The brace assemblies 34A and 34B are so secured to the supports 12A and 12B.

Each left brace 40A is horizontally aligned with a respective right brace 40B. The horizontally aligned left and right braces 40A and 40B are spaced by a first distance 60 in the middle of the frame 10 and by a second distance 62 in the front of the frame. A tool 64 can be inserted between opposing left and right braces 40A and 4 GB in the front of the frame. The tool 64 can have a width which is wider than the first distance 60 and smaller than the second distance 62. Such a tool may, for example, be a tool 64 which is used for inserting wafers between the supports 12A and 12B and withdrawing the wafers from between the B.

FIG. 4 is a cross-sectional end view through the middle of the boat 50 where the dimension 60 is taken and illustrates how one wafer 22 is supported. For purposes of further discussion it can be assumed that the wafer is round, when viewed from above, with a diameter of 300 mm, a thickness of 0.11 mm and is made of silicon. The wafer is thus relatively thin, as may be the case after a back-grind operation. The slots 18 have upper and lower surfaces 66 and 68 which taper towards one another. The upper surfaces 66 taper downwardly and away from a center line 69 of the wafer 22. The braces 40A and 40B have upper surfaces 70 which support a lower surface 72. The location at which the brace 40A supports the wafer 22 is approximately 50 mm to the left of the center line 69 and the location where the brace 40B supports the wafer 22 is also approximately 50 mm to the right of the center line 70. Due to the relative spacing of the braces 40A and 40B, the wafer 22 has a concave upper surface 76 and the lower surface 72 is convex. The surfaces 66 of the slots 18 support upper surfaces of the edges 26A and 26B, respectively, of the wafer 22. The wafer 22 is thus supported only at four locations, all four locations contributing to control the amount of bending of the wafer 22.

The frame 10 is thus retrofitted with the brace assemblies 34A and 34B. The braces 40A and 40B provide additional inner support for wafers located in the frame 10.

Figure 5:
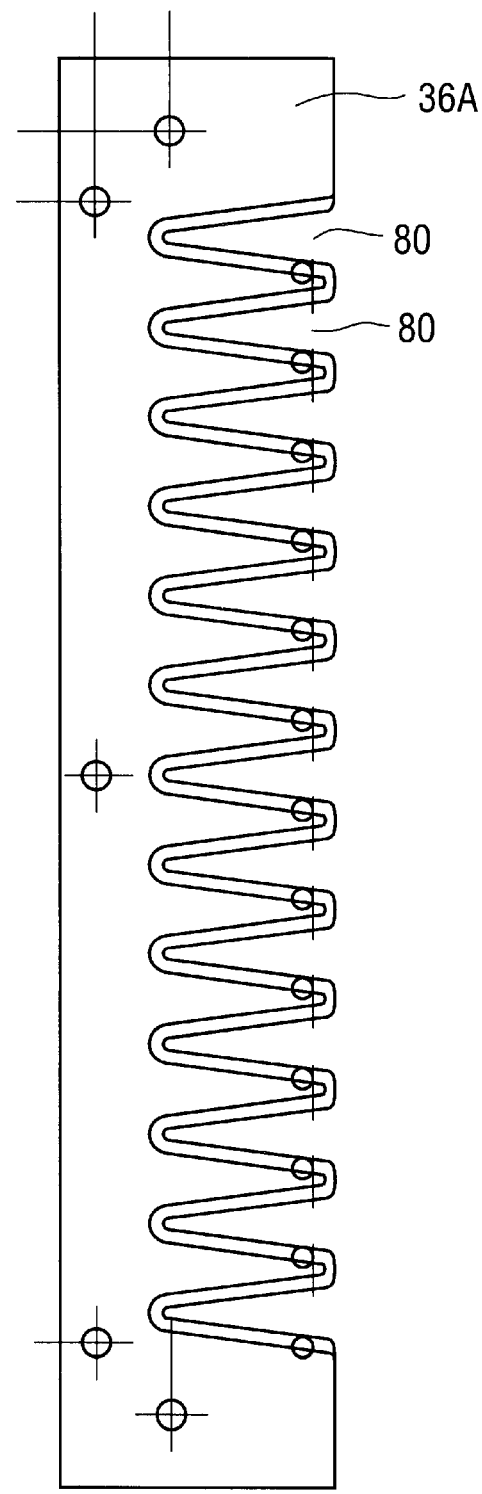
FIG. 5 is a front view of a bracket forming part of one of the brace assemblies.

FIG. 5 is a view of the left vertically extending front mount bracket 36A in the horizontal direction 24. A plurality of gaps 80 are formed above one another in a right vertical edge of the bracket 36A. Each gap 80 has a "V"-shape which is open to the right. A round wafer when being inserted in the direction 24 has a left edge which is first located over a right section of the gap 80 and then moves over to the left. Should the wafer be bent, the edge would ride up a surface of the gap 80 as it is being inserted.

Figure 6:
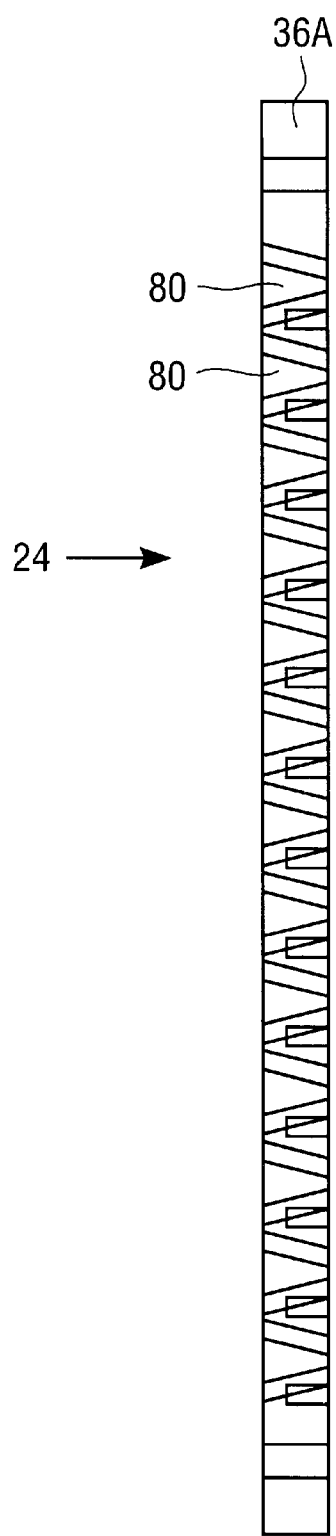
FIG. 6 is a side view of the bracket.

FIG. 6 is a view of the bracket 36A in a horizontal direction from the right support 12B to the left support 12A and shows that each gap 80 has a "V"-shape which is open to the left. A wafer being inserted is guided by the "V"-shape while being inserted in the direction 24.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A wafer boat comprising:
   a frame having left and right vertically extending, horizontally spaced supports each having a plurality of slots above one another so that a plurality of substantially horizontal wafers are horizontally insertable above one another with respective left edges of the wafers inserted in respective ones of the slots of the left support and respective right edges of the wafers inserted in respective ones of the slots in the right support;
   at least one vertically extending mount bracket secured to the frame and having a plurality of gaps formed therein through which edges of respective wafers are adapted to be inserted between the supports; and
   a plurality of braces, mounted to the bracket and via the bracket to the frame, each having a respective upper surface in a position to support a lower surface of a respective wafer between and distant from the slots in which the left and right edges of the wafer are inserted.

2. The wafer boat of claim 1 wherein the frame and the braces are separately manufactured and the braces are subsequently mounted to the frame.

3. The wafer boat of claim 1 wherein each gap has a "V"-shape when viewed in a horizontal direction in which the wafers are adapted to be inserted between the supports.

4. The wafer boat of claim 1 wherein each gap has a "V"-shape when viewed in a horizontal direction from one of the supports to the other support.

5. The wafer boat of claim 1 further comprising:
   a vertically extending front mount bracket; and
   a vertically extending rear mount bracket, each brace having a front end secured to the front mount bracket and a rear end secured to the rear mount bracket to form a brace assembly, the front and rear mount brackets being secured to a front and a rear of the frame, respectively, so as to mount the brace assembly to the frame.

6. The wafer boat of claim 5 wherein the front and rear mount brackets are secured to the same support of the left and right vertically extending supports.

7. The wafer boat of claim 1 wherein the braces are adapted to support each wafer at two spaced-apart locations.

8. The wafer boat of claim 7 wherein each wafer is supported by two of the braces.

9. The wafer boat of claim 8 wherein the two braces are spaced by a first distance between the locations where the two braces are adapted to support the wafer and by a second distance which is larger than the first distance and closer to a front of the frame.

10. The wafer boat of claim 9 wherein a tool is insertable into the front of the frame between the braces, the tool having a width of more than the first distance but less than the second distance.

11. The wafer boat of claim 1 wherein upper surfaces of the slots slope downwardly away from vertical center lines of the wafers.

12. A wafer boat comprising:
    a frame having left and right vertically extending, horizontally spaced supports each having a plurality of slots above one another so that a plurality of substantially horizontal wafers are horizontally insertable above one another with respective left edges of the wafers in respective ones of the slots of the left support and respective right edges of the wafers in respective ones of the slots in the right support;
    a vertically extending left rear mount bracket;
    a vertically extending left front mount bracket;
    a plurality of left braces, each having a rear end secured to the left rear mount bracket and a front end secured to the left front mount bracket so as to form a left mount assembly, the left rear mount bracket being secured to a rear of the left support and the left front mount bracket being secured to a front of the left support;
    a vertically extending right rear mount bracket;
    a vertically extending right front mount bracket; and
    a plurality of right braces, each having a rear end secured to the right rear mount bracket and a front end secured to the right front mount bracket so as to form a right mount assembly, the right rear mount bracket being secured to a rear of the right support and the right front mount bracket being secured to a front of the right support, a lower surface of each wafer being supported at spaced locations by upper surfaces of one left brace and one right brace.

13. The wafer boat of claim 12 wherein the left and right braces are spaced by a first distance between the locations where the left and right braces support the wafer and by a second distance which is larger than the first distance and closer to a front of the frame.

14. A wafer boat comprising:
    a frame having left and right vertically extending, horizontally spaced supports each having a plurality of slots above one another so that a plurality of substantially horizontal wafers are horizontally insertable above one another with respective left edges of the wafers inserted in respective ones of the slots of the left support and respective right edges of the wafers inserted in respective ones of the slots in the right support;
    a vertically extending front mount bracket;

a vertically extending rear mount bracket; and a plurality of braces, each brace having a front end secured to the front mount bracket and a rear end secured to the rear mount bracket to form a brace assembly, the front and rear mount brackets being secured to a front and a rear of the frame, respectively, so as to mount the brace assembly to the frame, each brace having a respective upper surface in a position to support a lower surface of a respective wafer between and distant from the slots in which the left and right edges of the wafer are inserted.

15. A wafer boat comprising:

a frame having left and right vertically extending, horizontally spaced supports each having a plurality of slots above one another so that a plurality of substantially horizontal wafers are horizontally insertable above one another with respective left edges of the wafers inserted in respective ones of the slots of the left support and respective right edges of the wafers inserted in respective ones of the slots in the right support; and a plurality of braces, mounted to the frame, each having a respective upper surface in a position to support a lower surface of a respective wafer between and distant from the slots in which the left and right edges of the wafer are inserted, wherein the two braces are spaced by a first distance between the locations where the two braces are adapted to support the wafer and by a second distance which is larger than the first distance and closer to a front of the frame.

* * * * *

UNITED STATES PATENT AND TRADEMARK OFFICE
CERTIFICATE OF CORRECTION

PATENT NO. : 6,615,994 B2
DATED : September 9, 2003
INVENTOR(S) : Cu, Jr.

It is certified that error appears in the above-identified patent and that said Letters Patent is hereby corrected as shown below:

Column 2,
Line 49, delete "4 GB", insert -- 40 B --.
Line 54, delete "B.", insert -- supports 12A and 12B. --.

Signed and Sealed this

Seventeenth Day of February, 2004

JON W. DUDAS
*Acting Director of the United States Patent and Trademark Office*